(12) United States Patent
Tehan et al.

(10) Patent No.: US 6,239,972 B1
(45) Date of Patent: May 29, 2001

(54) INTEGRATED CONVECTION AND CONDUCTION HEAT SINK FOR MULTIPLE MOUNTING POSITIONS

(75) Inventors: Matthew A. Tehan; Armand Losinski; Jay Berkley Parkinson, all of Albuquerque, NM (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/460,196

(22) Filed: Dec. 13, 1999

(51) Int. Cl.[7] ..................................................... H05K 7/20
(52) U.S. Cl. .......................... 361/704; 361/707; 361/709; 361/715; 361/719; 361/720; 165/80.2; 165/185; 174/16.3
(58) Field of Search .................................. 361/704, 707, 361/709, 713, 715, 716, 719–721, 756–758; 174/16.3, 252; 165/80.3, 104.33

(56) References Cited

U.S. PATENT DOCUMENTS

| | | | |
|---|---|---|---|
| 4,441,140 | * 4/1984 | Richard | 361/720 |
| 4,971,570 | 11/1990 | Tolle et al. . | |
| 5,140,500 | * 8/1992 | Klein et al. | 361/707 |
| 5,187,642 | * 2/1993 | Garner et al. | 361/719 |
| 5,208,733 | 5/1993 | Besanger . | |
| 5,220,485 | 6/1993 | Chakrabarti . | |
| 5,258,887 | * 11/1993 | Fortune | 361/720 |
| 5,276,585 | 1/1994 | Smithers . | |
| 5,369,301 | 11/1994 | Hayashi et al. . | |
| 5,385,175 | 1/1995 | Rivero et al. . | |
| 5,472,353 | 12/1995 | Hristake et al. . | |
| 5,508,885 | 4/1996 | Ishimoto . | |
| 5,542,468 | 8/1996 | Lin . | |
| 5,615,735 | 4/1997 | Yoshida et al. . | |
| 5,815,371 | 9/1998 | Jeffries et al. . | |
| 5,831,829 | 11/1998 | Lin . | |
| 5,835,349 | * 11/1998 | Giannatto et al. | 361/701 |
| 5,886,821 | 3/1999 | Sohn . | |
| 5,898,750 | 4/1999 | Ridder et al. . | |
| 5,930,115 | 7/1999 | Tracy et al. . | |
| 5,953,212 | 9/1999 | Lee . | |
| 5,959,350 | 9/1999 | Lee et al. . | |
| 5,999,407 | * 12/1999 | Meschter et al. | 361/704 |
| 6,064,575 | * 5/2000 | Urda et al. | 361/721 |

* cited by examiner

*Primary Examiner*—Leo P. Picard
*Assistant Examiner*—Boris L. Chervinsky
(74) *Attorney, Agent, or Firm*—Loria B. Yeadon

(57) ABSTRACT

An integrated thermal management system for electronic devices includes a printed wiring board for supporting electronic devices, at least one die-up and one die-down electronic device, a frame and a heat sink. The board includes at least one thermally conductive layer, to which the die-down device is thermally connected. The frame member, which includes at least a first heat sink mounting location, is connected to one of the first and second surfaces of the board, adjacent to the edge. The heat sink itself, which is cantilevered over the die-up electronic device from at least one heat sink mounting location, includes a portion which is adapted to engage the die-up electrical device, a portion connected to the frame member to provide a conductive path from the die-up device to the frame member, and a convective cooling portion. The thermal management structure also includes a cold wall, which engages the frame to provide a thermally conductive connection between the frame member and the cold wall. The heat sink(s) covers only the die-up electronic device(s) and those portions of the board surface (s) between the die-up electronic device(s) and the frame necessary to thermally connect the die-up electronic device (s) to the frame, to thereby provide access to the board surfaces for inspection or testing without removal of the heat sink(s).

17 Claims, 8 Drawing Sheets

INTEGRATED CONVECTION AND CONDUCTION HEAT SINK FOR MULTIPLE MOUNTING POSITIONS

UNITED STATES GOVERNMENT RIGHTS

The invention as made with United States Government support under Contract No. F33657-95-D-2026 awarded by the U.S. Air Force. The Government has certain rights to this invention.

CROSS-REFERENCE TO RELATED APPLICATIONS

Not applicable.

BACKGROUND OF THE INVENTION

The present invention relates, generally, to apparatus for and methods of the thermal management of electronic devices (whether die-up, die-down, discrete surface mount technology or discrete through-hole) mounted on printed circuit boards.

Thermal management of electronic devices on printed wiring boards is usually accomplished in one or more of three ways: (1) by providing enhanced conduction paths to heat transfer surfaces which are at lower temperatures than the device; or (2) by increasing convection (natural or forced) from the surface of the device to a lower temperature surrounding ambient fluid, usually air; or (3) radiation. In many applications, especially military avionics, the convection and conduction methods are usually mutually exclusive of each other.

With through-hole microcircuit devices conduction heat sinks usually include thermally conductive metal strips located under the body of the device and above the surface of the printed wiring board. The strips conduct heat from the bottom of such a device to a lower temperature heat transfer device, sometimes referred to as a cold wall. The metal strips are often arranged in a contiguous pattern which allows for fabrication by machining and attachment to the printed wiring board. A cold wall is a heat transfer device, such as a hollow structure through which a cooling medium (e.g., air, water) flows.

With through-hole conduction heat sinks, a unique heat sink is usually created for each printed wiring board. The design and fabrication of the heat sink is therefore dependent upon the precise placement of the components on the printed wiring board. Also, such conduction heat sinks cannot be used with surface mounted devices (e.g., quad-flat packs, leadless chip carriers). Conduction heat sinks are not compatible with die-up components.

Commercially available convection heat sinks for microcircuits generally include extended surfaces (e.g., fins, pins, cones, plates) joined to a mounting surface. The heat sink is usually only attached to the electronic component with a thermally conductive adhesive. Such attachment is sometimes augmented with mechanical fasteners to the printed wiring board itself. With commercially available convection heat sinks, the dynamic load contributed by the mass of the heat sink during vibration must be supported by the solder joints of the device being cooled. This can lead to increased fatigue of the solder joints. If the heat sink is attached to the printed wiring board, holes must be added to the printed wiring board. Such holes, and the associated required keep out areas for mechanical attachment, increases the difficulty of routing electrical traces and component placement. It also reduces the space available for component placement.

In addition, current and future printed wiring assemblies are (or will) require integrating a variety of electronic components on the same assembly, such as: die-down (i.e., military, conduction cooled) components; die-up (i.e., commercial, convection cooled) components; discrete surface mount technology (SMT); and discrete through-hole components. An example of this is integrating commercial components into environments where there is less margin between the temperature rating of the commercial component and the temperature of the cooling medium. A specific example is integrating convection cooled parts into conduction cooled military avionics.

U.S. Pat. No. 5,930,115 to Tracy et al. discloses a thermal management structure which is designed to provide both mechanical isolation and heat removal for an unpackaged semiconductor die mounted directly on a printed circuit board substrate. The thermal management structure sandwiches the unpackaged semiconductor die and printed circuit board substrate between two heat sink pieces and conductively removes heat from the die and the substrate. Either or both of the heat sinks may have expanded surfaces, such as pins, fins or the like, which increase the surface area of the heat sink to enhance passive or forced convective heat removal to the ambient environment. These heat sinks may also be designed to engage other components (of the end product in which such heat sinks are employed, such as the chassis or frame) to conductively remove heat away from both the heat sinks and the unpackaged semiconductors.

It is an object of the present invention to maximize the heat transfer from components, both die-down and die-up in a common assembly, wherever they may be located on a printed wiring board, by utilizing integrated convection and conduction paths (for die-up components) and conduction paths (for die-down components).

It is an object of the present invention to effectively integrate the use of convection cooled commercial components into conduction cooled military avionics electronic assemblies.

It is another object of the present invention to minimize the impact of the thermal management of both die-up and die-down components on the electrical design of the printed wiring boards (e.g., component placement, area available for trace routing, etc.).

It is another object of the present invention to provide for a thermal management system which allows component placement and electrical design to occur independently of heat sink design.

It is yet another object of the present invention to simultaneously provide integrated conduction and convection paths for die-up components.

It is yet another object of the present invention to provide a common frame for a family of printed wiring assemblies, and to provide such frame with multiple heat sink mounting locations.

It is yet another object of the present invention to provide a frame for a printed wiring assembly and to attach heat sinks to such a frame to reduce the dynamic load imparted to the electronic component and lessen fatigue effects on solder joints. The heat sink(s) are attachable to the frame by a variety of methods.

It is yet another object of the invention to provide a thermal management system which does not require holes in the field of the printed wiring board, to thereby eliminate the need for keep out areas, and increase the area available for component placement and routing electrical signals.

It is yet a further object of the present invention to stabilize heat sinks by attaching them to the frame at more than one location.

It is yet another object of the present invention to maximize the heat transfer from components, both die-down and die-up in a common assembly, wherever they are located on a printed wiring board, by utilizing integrated convection and conduction paths (for die-up components) and conduction paths (for die-down components) and to allow access to all, or at least some, of such components for inspection and/or electrical testing.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

An integrated thermal management system for electronic devices includes a printed wiring board for supporting electronic devices, at least one die-up and one die-down electronic device, a frame and a heat sink. The printed wiring board has a first surface, a second surface and a continuous edge interconnecting the first and second surfaces. The board also includes at least one thermally conductive layer. The die-up electronic device and the die-down electronic device are mounted on at least one of the first and second surfaces. The die-down device is thermally connected to the thermally conductive layer(s). The frame member, which includes at least a first heat sink mounting location, is connected to one of the first and second surfaces of the board adjacent to the edge. The heat sink itself, which is cantilevered over the die-up electronic device from the at least one heat sink mounting location, includes a portion which is adapted to engage the die-up electrical device, a portion connected to the frame member to provide a conductive path from the die-up device to the frame member, and a convective cooling portion. The thermal management structure also includes a cold wall. The frame member including means for engaging the cold wall to provide a thermally conductive connection between the frame member and the cold wall. The heat sink(s) covers only the die-up electronic device(s) and those portions of the board surface (s) between the die-up electronic device(s) and the frame necessary to thermally connect the die-up electronic device (s) to the frame, to thereby provide access to the board surfaces for inspection or testing without removal of the heat sink(s).

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

Figure 1:
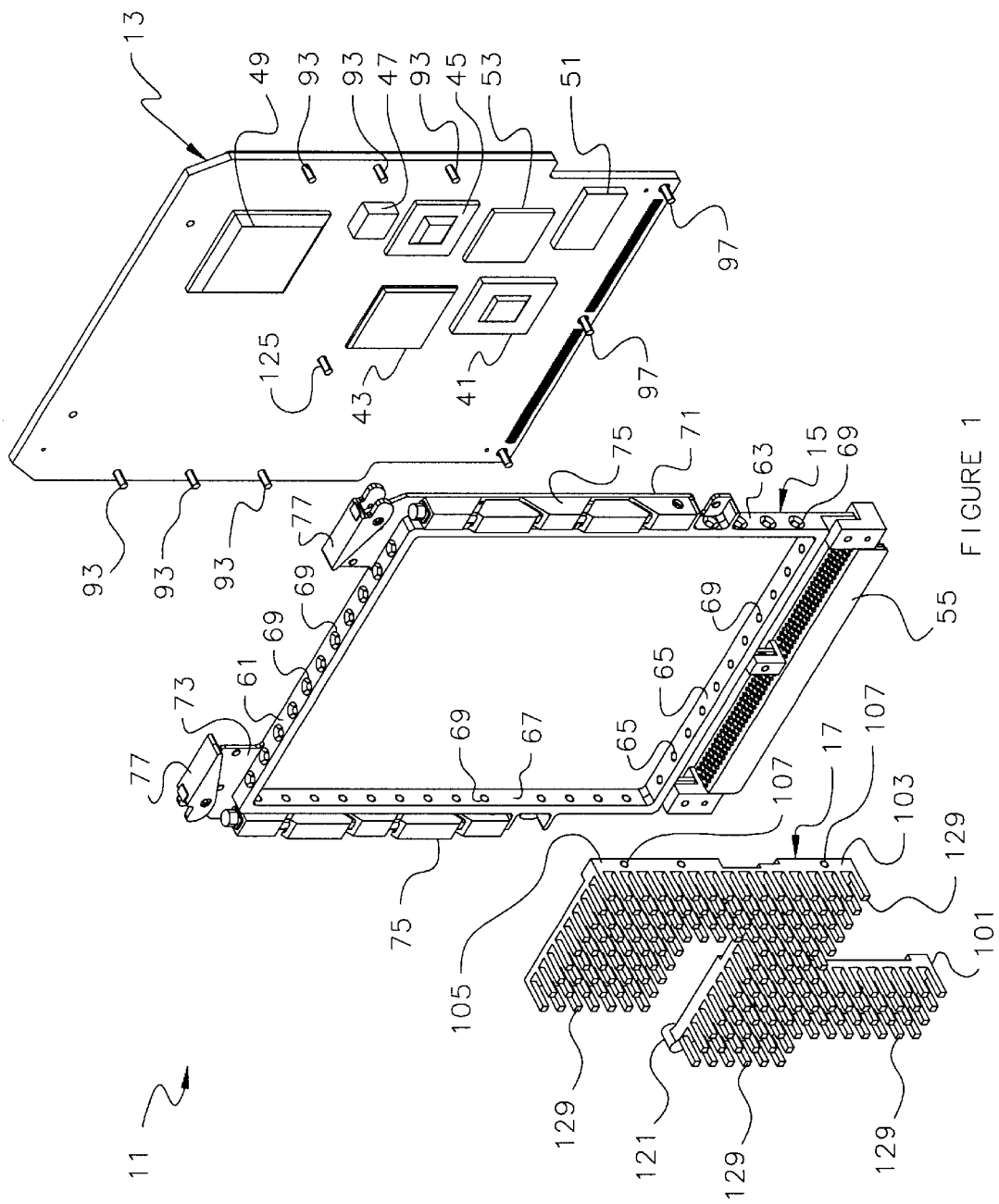
FIG. 1 is a front exploded perspective view of the wiring assembly of the present invention.

With reference to FIG. 1, printed wiring assembly 11 includes a printed wiring board 13, a frame assembly 15, and an integrated conduction and convection heat sink 17.

Figure 4:
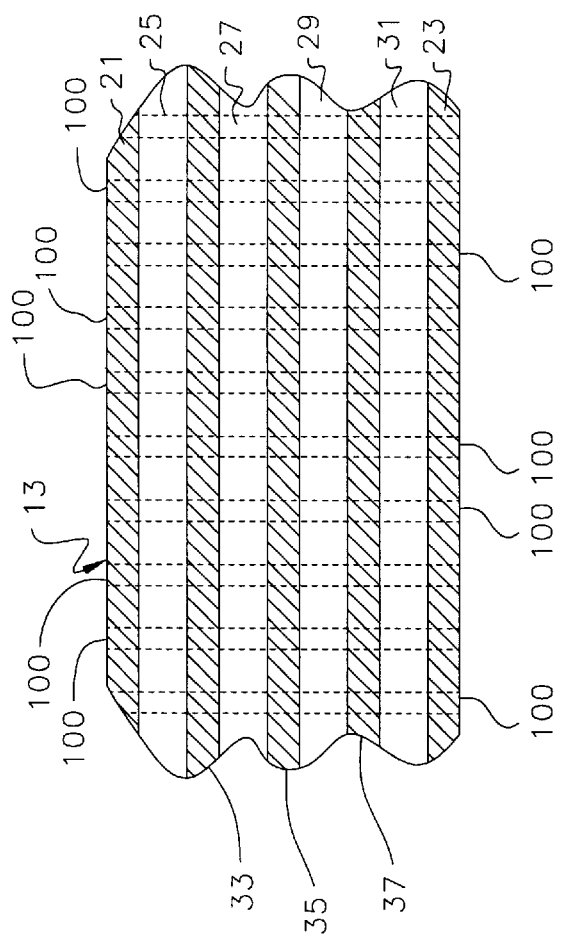
FIG. 4 is an enlarged, partial end view of the printed wiring board of the present invention.

As is evident from FIG. 4, printed wiring board 13 (sometimes referred to as PWB) includes, inter alia, a top layer of insulating material 21, a bottom layer of insulating material 23 and thermally conductive layers 25 and 31. As those skilled in the art will appreciate, PWB 13 will, depending upon the complexity of the wired circuitry, include additional intermediate layers of signal, ground and power conductors, such as indicated by layers 27 and 29, all interspersed by layers of insulating material 33, 35 and 37. As those skilled in the art will also appreciate, some layers have multiple functions (e.g., thermal and ground, thermal and power). The insulating materials can be of a variety of materials including polyimide, FR4, thermont, fiberglass, epoxy and combinations thereof. Preferably thermally conductive layer is made of at least 1 oz. copper, although the use of other thermally conductive materials is possible as will be apparent to those skilled in the art. Alternatively, one or both of thermally conductive layers 25 and 31 can be on the outside surface of layers 21 or 23.

A variety of electronic components (whether die-up, die-down, discrete surface mount and/or discrete through-hole) can be mounted on PWB 13. For purposes of illustration, die-up devices 41, 43, 45, 47 and 49 are mounted on PWB 13. Also included are die-down devices 51 and 53. Die-up devices can include Motorola PPC603 P/N TSXP603PUAU8L, Tundra Real Image P/N M6458OWG, and Intel i960RP P/N GC80960RP3V33SL2GD; die-down devices can include Micrel Regulator P/N MIC 29301-SOBU, Analog Devices Voltage Reference P/N 5962-728022A, and Q-Tech Oscillator P/N QT66HC11-30.868 MHz. Finally, PWB 13 includes a connector 55, such as manufactured by Airborn P/N RM 422-196-192-9500-919.

Figure 2:
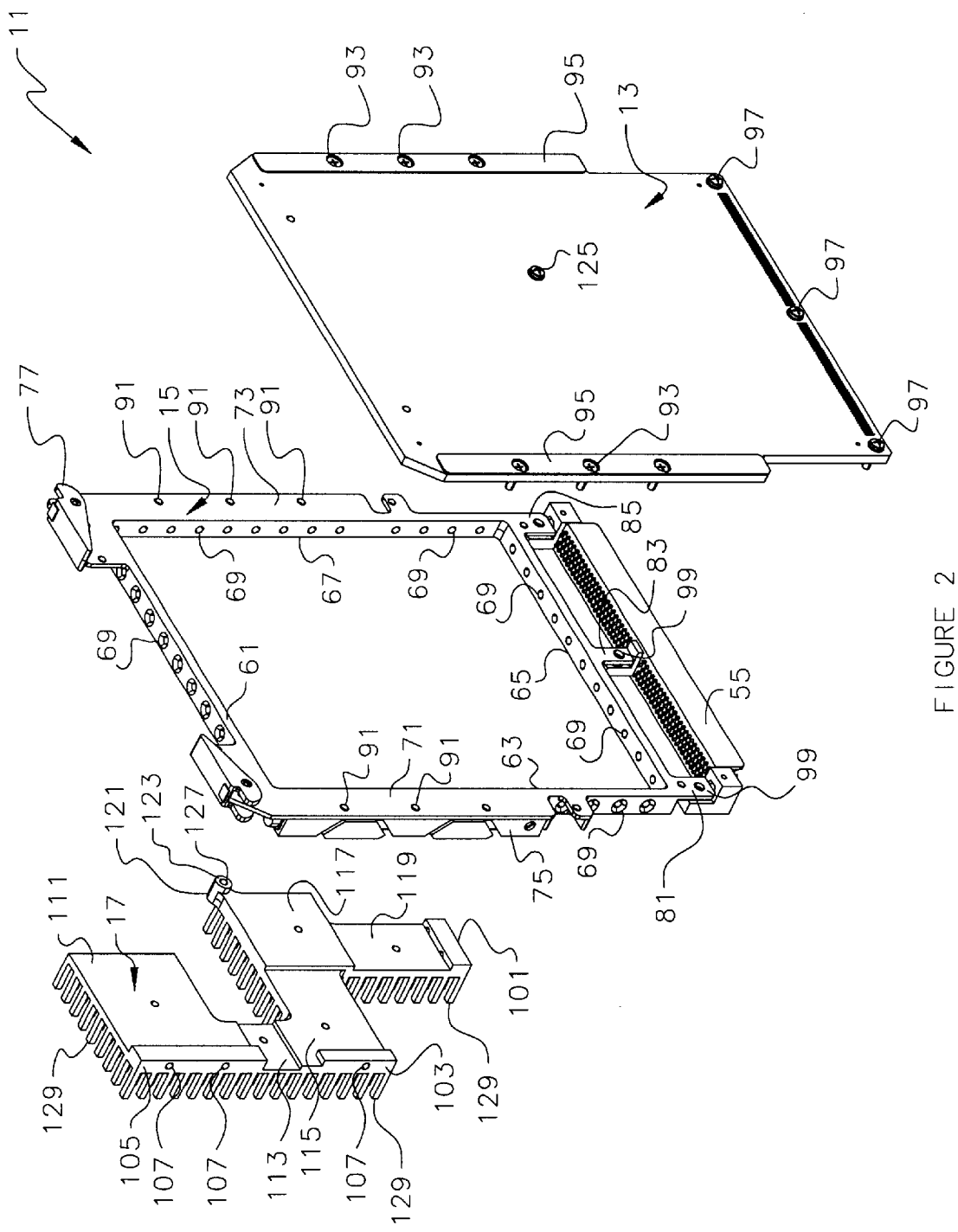
FIG. 2 is a back exploded perspective view of the wiring assembly of the present invention.

Frame assembly 15 includes frame portions 61, 63, 65 and 67 which, typically, form a rectangle although other configurations are possible. Aluminum is a preferred material. However, a variety of thermally conductive metals, composites and plastics can be used. As explained below, each portion includes a plurality of holes 69 for mounting one or more heat sinks 17. Assembly 15 also includes a pair of flanges 71 and 73 which, in turn, are used to mount wedgelocks 75 and card ejectors 77. Wedgelocks 75 are manufactured by Calmark (see, e.g., U.S. Pat. No. 4,819,713). Assembly 15 further includes, as best seen in FIG. 2, three projections 81, 83 and 85, which are used to mount connector 55 to frame portion 65 and PWB 13. Finally, flanges 73 and 75 include a plurality of holes 91.

Figure 5:
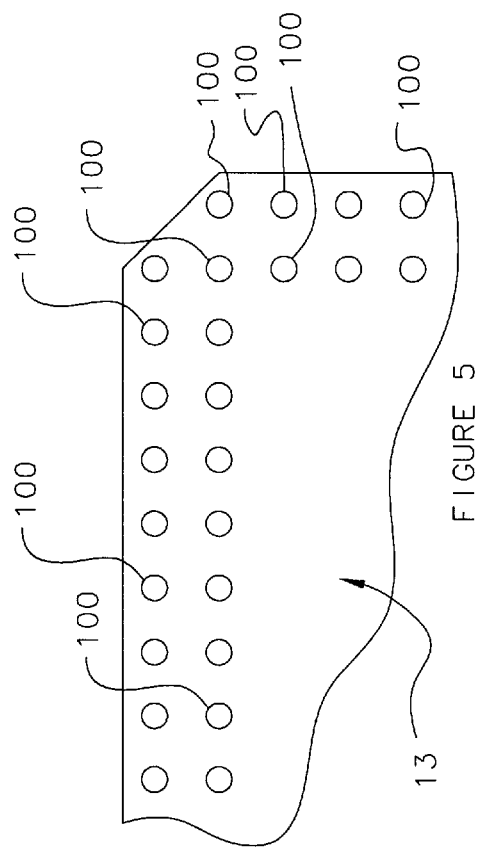
FIG. 5 is a top plan view of a portion of the printed wiring board of the present invention.

PWB 13 and spacer strips 95 are secured to flanges 71 and 73 by a plurality of machine screws 93 or other fasteners which pass through openings in strips 95 (not shown), openings in PWB 13, holes 91, and are secured in tapped holes (not shown) provided in wedgelocks 75. Board 13 is also secured to projections 81, 83 and 85 by machine screws 97 which pass through holes 99 and are received in tapped holes (not shown) in connector 55. With reference to FIGS. 4 and 5, the thermal vias 100 which thermally couple, for instance, thermally conductive layer 25 to frame assembly 15 are illustrated.

Figure 3:
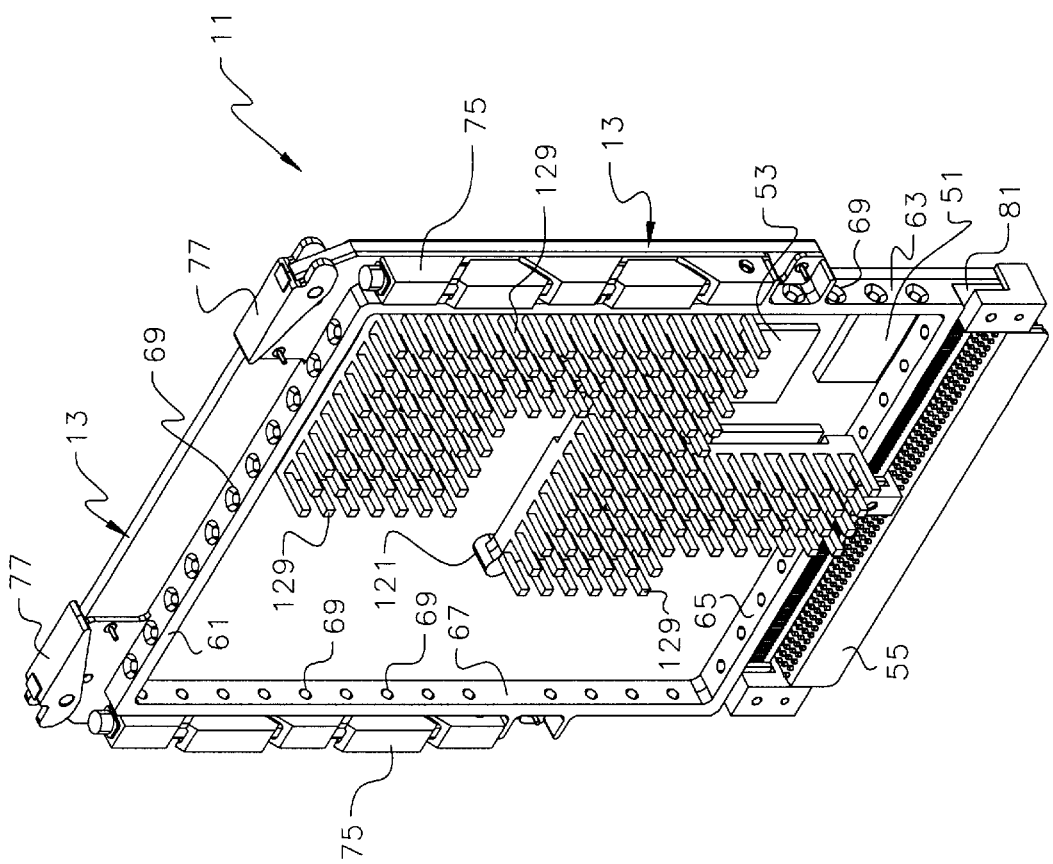
FIG. 3 is a front perspective view of the wiring assembly of the present invention.

With reference to FIGS. 1 and 2, heat sink 17 is configured to overlay and thermally contact die-up devices 41, 43, 45, 47 and 49. Heat sink 17, which is made of aluminum or other suitable thermally conductive material, includes spaced apart portions 101, 103 and 105 which are adapted to be secured to frame portions 63 and 65, as illustrated in FIG. 3, by machine screws (not shown) which are received in openings 69 and tapped openings 107. As is evident from FIG. 2, the thickness of heat sink 17 does not have to be uniform, but includes a series of planar surfaces 111, 113, 115, 117 and 119. This variation in thickness is determined by the various heights of the components above the top surface of printed wiring board 13, so that each surface is in close proximity the top surface of its associated component (i.e., 41, 43, 45, 47 and 49). To thermally connect, for instance, surface 119 with the exposed surface of component 41, a thermally conductive gap filling material (e.g. aluminum oxide filled elastomers, thermally conductive grease, thermally conductive wax, thermally conductive epoxy) (not shown) is utilized. Such gap filling materials are used to accommodate the height variational tolerances of the components. With this arrangement, heat sink 17 conducts heat from devices 41, 43, 45, 47 and 49 to frame components 63 and 65.

To provide additional structural support or increase the thermal connection to PWB 13, heat sink 17 can also be provided with a projection 121 having a surface 123 which engages the top surface of PWB 13 and is held in engagement therewith by machine screw 125 and cooperating tapped hole 127. To provide convection cooling, the top surface is provided with a plurality of fins or pins 129.

Figure 6:
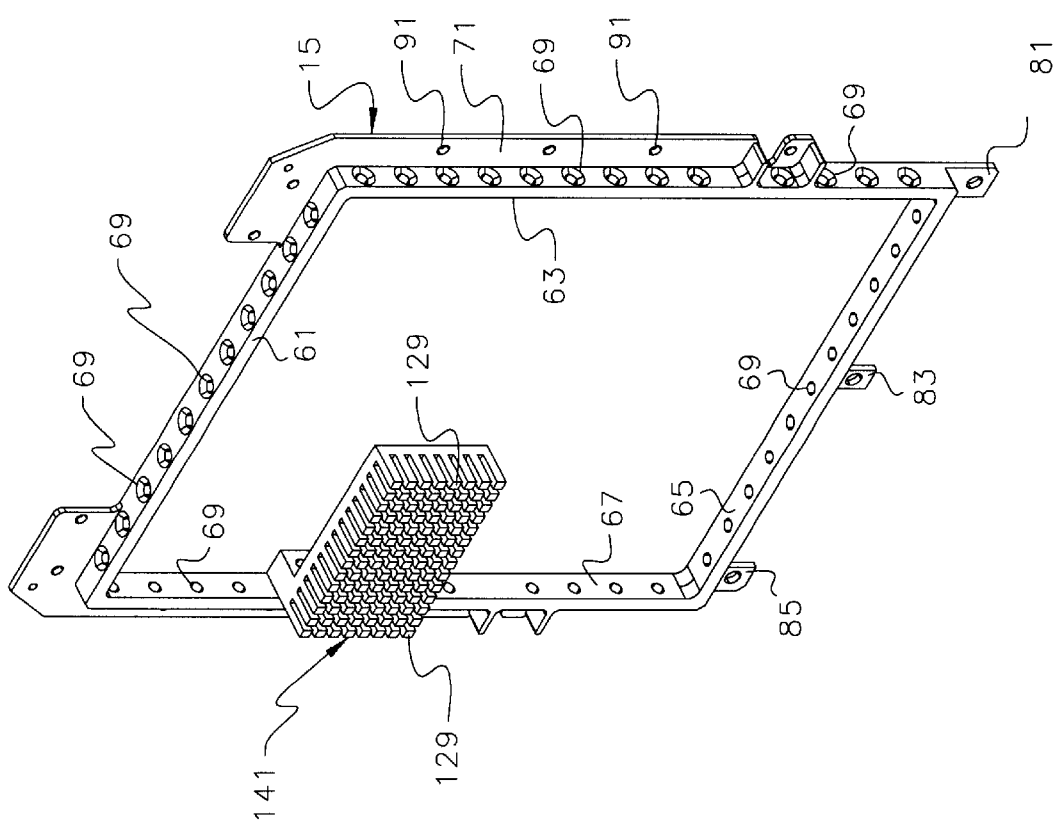
FIG. 6 is a perspective view of a conduction and convention heat sink (for a die-up component) cantilevered from just one location on the assembly frame.
Figure 7:
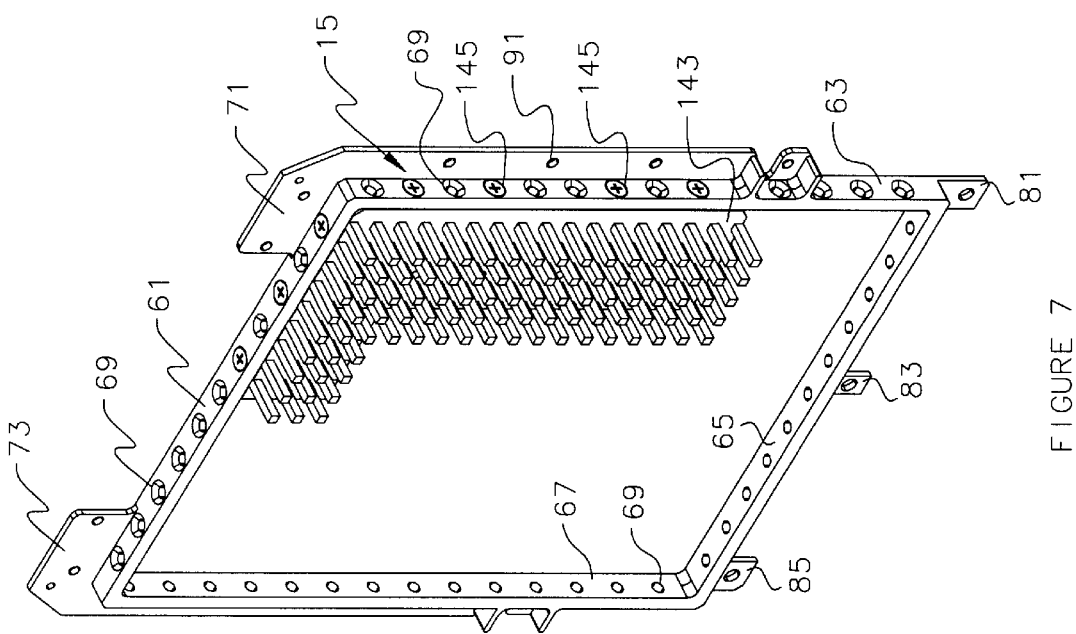
FIG. 7 is a perspective view of a conduction and convection heat sink (for a die-up component) cantilevered from two spaced apart locations on the assembly frame.
Figure 8:
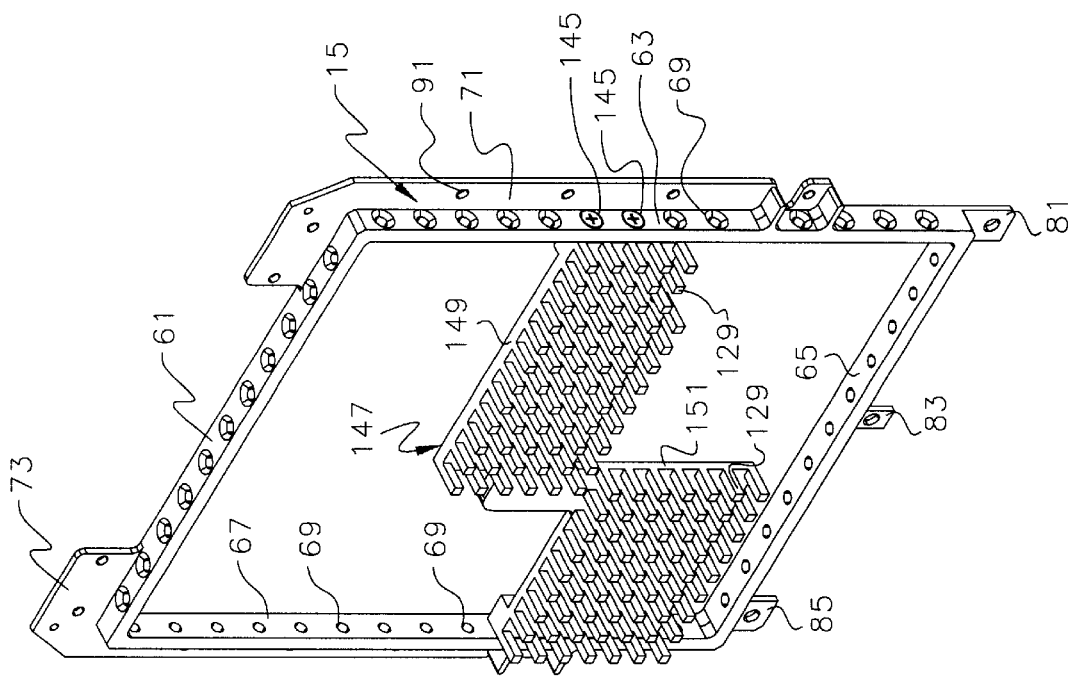
FIG. 8 is a perspective view of a conduction and convection heat sink (for a die-up component) suspended across the assembly frame.

The size and shape of the heat sink (or heat sinks) is determined by the number and location of, for instance, die-up devices. With reference to FIGS. 6, 7 and 8, alternate embodiments are illustrated. FIG. 6 illustrates a very simple cantilever mounted design 141, which is attached just to frame portion 67 by machine screws (not shown) received in, preferably, to two or more adjacent (or nearly adjacent) openings 69. FIG. 7 illustrates an L-shaped heat sink 143 which is secured to frame member 63 by machine screws 145 and secured to frame member 61 by additional machine screws 145. FIG. 8 illustrates heat sink 147 which bridges frame members 63 and 67. In its simplest form, it can be a simple, straight span. As illustrated, heat sink 147 has offset portions 149 (connected to frame member 63 via machine screws 145) and 151 (connected to frame member 67 via machine screws (not shown)). All the foregoing heat sinks include fins 129 for convection cooling.

As those skilled in the art will appreciate, an infinite variety of heat sink configurations can be provided for, depending upon the number and location of the die-up devices on PWB 13. Heat sink 141 can be used alone, in connection with other cantilever heat sinks, or in connection with heat sinks 143 or 147. This permits the greatest flexibility in the design and layout of the components on printed wiring board 13, while permitting (in contrast to the arrangement disclosed by Tracy et al.) access to at least some, and preferably all of the components for inspection and/or electrical testing. It also allows for component placement and electrical design to occur independently of the heat sink design.

Figure 9:
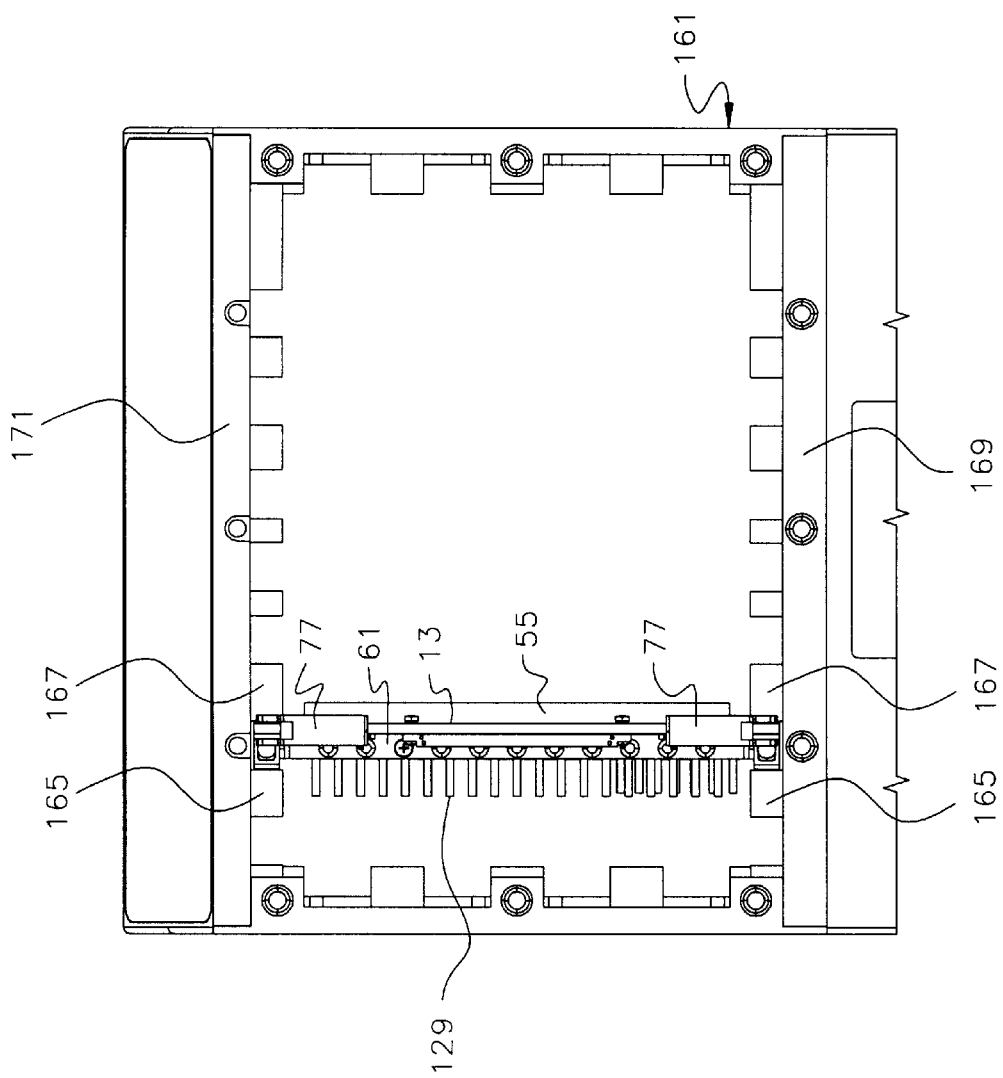
FIG. 9 is a top plan view showing the wiring assembly of FIGS. 1–3 in an assembly having a cold wall.

As those skilled in the art will appreciate, heat sinks 17, 141, 143 and 147 cool die-up devices (and unpackaged electronic devices such as Micro Rel Driver L154C) by both convection cooling (via fins 129) and conduction cooling to the frame assembly 15. The die-down devices are cooled via conductive layers 25 and 31 to frame assembly 15. As illustrated in FIG. 9, printed wiring assembly 11 is received in chassis 161, such as used in avionics, ground, ship and space applications. Chassis 161 includes card guides 165 and 167, and cold walls 169 and 171. Convection cooling is provided by moving air across fins 129. This could be achieved by natural convection or forced air. Forced air could be supplied by internal air movers (not shown) or external systems (not shown). Conduction cooling is achieved by the mechanical (and thermal) contact between frame assembly 15 (including wedgelocks 75) and the card guides 165, 167 provided on housing 161. Card guides 165, 167 are, in turn coupled to cold walls 169, 171. As those skilled in the art will appreciate, such cold walls include one or more mechanisms by which heat is dissipated (e.g. secondary forced air, forced liquid cooling) from the attachment interface (not shown).

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. An integrated thermal management system for electronic devices, including die-up and die-down electronic devices, which can be mounted on a printed wiring board, said thermal management structure comprising:

a printed wiring board for supporting electronic devices, said board having a first surface, a second surface and a continuous edge interconnecting said first and second surfaces, said board also including a thermally conductive layer in communication with the printed wiring board;

at least one die-up electronic device and at least one die-down electronic device mounted on at least one of said first and second surfaces, said die-down device being thermally connected to said thermally conductive layer;

a frame member connected to one of said first and second surfaces adjacent to said edge, said frame having at least a first heat sink mounting location; and a combination conductive and convective heat sink, said heat sink comprising:

a conductive portion comprising a first portion in direct contact with said die-up electrical device; and a second portion in direct contact with said first portion connected to said frame member to provide a conductive path from said die-up electronic device to said frame member; and a convective cooling portion.

2. The thermal management system of claim 1, further including a cold wall, said frame member including means for engaging said cold wall to provide a thermally conductive connection between said frame member and said cold wall.

3. The thermal management system of claim 1, wherein said heat sink is cantilevered over said die-up electronic device from said first heat sink mounting location.

4. The thermal management system of claim 3, wherein said heat sink is connected to said die-up electronic device via a thermally conductive material.

5. The thermal management system of claim 4, wherein said thermally conductive material comprises a member from the group consisting of aluminum oxide filled silicone elastomers, thermally conductive grease, thermally conductive wax and thermally conductive epoxy.

6. The thermal management system of claim 1, wherein said frame member includes a second heat sink mounting location, said first location being separated from said second location, and wherein said heat sink is supported by said frame at both said first and said second heat sink mounting locations.

7. The thermal management system of claim 6, wherein said frame member includes a first and a second portion, said first portion being spaced apart and opposite from said second portion, said heat sink bridging said first and second frame portions.

8. The thermal management system of claim 1, wherein said thermally conductive layer is captured between at least two electrically insulative layers.

9. The thermal management system of claim 1, wherein said thermally conductive layer is on at least one of said first and second surfaces.

10. The thermal management system of claim 1, wherein said printed wiring board includes a plurality of thermally conductive layers.

11. The thermal management system of claim 1, wherein said thermally conductive layer is thermally connected to said frame via thermal vias.

12. The thermal management system of claim 1, wherein said frame is continuous with said edge and said board is attached to said frame in a manner that provides additional stiffness to said board.

13. The thermal management system of claim 1 wherein said convective cooling portion includes a plurality of projections.

14. The thermal management system of claim 1, wherein said heat sink covers only said at least one die-up electronic device and those portions of said first and second surfaces between said at least one die-up electronic device and said frame necessary to thermally connect said at least one die-up electronic device to said frame, to thereby provide access to said first and second surface for inspection or testing without removal of said heat sink.

15. A thermal management structure for electronic devices which can be mounted on a printed wiring board, said thermal management structure comprising:

a printed wiring board for supporting electronic devices, said board having a first surface, a second surface and a continuous edge interconnecting said first and second surfaces;

at least one electronic device mounted on one of said first and second surfaces;

a frame member connected to one of said first and second surfaces adjacent to said edge, said frame having at least one heat sink mounting location;

a heat sink, said heat sink in direct contact with said electrical device and said frame member to provide a conductive path from said electronic device to said frame member, said heat sink also including a convective cooling portion; and a cold wall, said frame member including means for engaging said cold wall to provide a thermally conductive, connection between said frame member and said cold wall.

16. The thermal management system of claim 15, wherein said electronic device is a die-up device.

17. The thermal management system of claim 15, wherein said electronic device is an unpackaged electronic device.

* * * * *